United States Patent [19]
Kern et al.

[11] Patent Number: 5,650,377
[45] Date of Patent: Jul. 22, 1997

[54] SELECTIVE EPITAXIAL GROWTH OF HIGH-$T_C$ SUPERCONDUCTIVE MATERIAL

[75] Inventors: Dieter Paul Kern, Amawalk; Robert Benjamin Laibowitz, Peekskill; Kim Yang Lee, North Tarrytown, all of N.Y.; Mark I. Lutwyche, Cambridge University, United Kingdom

[73] Assignee: International Business Machines Corporation, Armonk, N.Y.

[21] Appl. No.: 132,145

[22] Filed: Oct. 5, 1993

Related U.S. Application Data

[63] Continuation of Ser. No. 621,180, Nov. 30, 1990, abandoned.

[51] Int. Cl.[6] ................................................. H01L 39/24
[52] U.S. Cl. .................... 505/330; 505/473; 505/474; 505/410; 505/413; 505/728; 505/729; 505/238; 427/62; 427/63
[58] Field of Search ........................ 505/470, 473, 505/474, 330, 238, 235, 413, 729; 427/62, 63; 156/643

[56] References Cited

U.S. PATENT DOCUMENTS

| | | | |
|---|---|---|---|
| 3,615,929 | 10/1971 | Waters et al. | 148/175 |
| 3,850,707 | 11/1974 | Bestland | 148/175 |
| 4,412,868 | 11/1983 | Brown et al. | 148/1.5 |
| 4,826,784 | 5/1989 | Salerno et al. | 437/89 |
| 4,900,709 | 2/1990 | Heijman et al. | 505/1 |
| 4,933,318 | 6/1990 | Heijman | 505/1 |
| 5,104,848 | 4/1992 | Miedema et al. | 505/1 |

FOREIGN PATENT DOCUMENTS 1-283887  11/1989  Japan.

OTHER PUBLICATIONS

A. Inoue et al. *Japanese Journal of Applied Physics*, vol. 26, pp. L1443–L1444 (Sep. 1987).

H. Nakane et al. *Japanese Journal of Applied Physics*, vol. 26, pp. L1925–L1926 (Nov. 1987).

H. Tanabe et al. *Japanese Journal of Applied Physics*, vol. 26, pp. L1961–L1963 (Dec. 1987).

P. F. Miceli et al., in *Thin Film Processing and Characterization of High–Temperature Superconductors*, (American Vacuum Society, 1988), pp. 150–158.

R. L. Burton et al., in *Thin Film Processing and Characterization of High–Temperature Superconductors*, (American Vacuum Society, 1988) pp. 166–173.

A. M. DeSantolo et al., in Thin Film Processing and Characterization of *High–Temperature Superconductors*, (American Vacuum Society, 1988), pp. 174–181.

A Mogro–Campero, "A review of high–temperature superconducting films on silicon", Supercond. Sci. Technol. 3 (1990) pp. 155–158.

Simon "Substrate for HTS films" SPIE vol. 1187 Processing of Films for high Tc Superconducting Electronics (1989) p. 2–p. 11.

Ma et al, "Novel method of patterning YBaCuO superconducting thin films," Appl. Phys. lett. 55(9) Aug. 1989 pp. 896–898.

*Primary Examiner*—Roy V. King
*Attorney, Agent, or Firm*—Daniel P. Morris

[57] ABSTRACT

Fine epitaxial patterns of yttrium barium copper oxide on a strontium titanate substrate are provided by using a silicon nitride mask to define the pattern to be formed. A thin film of yttrium barium copper oxide is placed on the silicon nitride mask and exposed portions of strontium titanate substrate. Where the yttrium barium copper oxide is in contact with the silicon nitride mask, it is nonepitaxial in crystal structure. Where the yttrium barium copper oxide contacts the strontium titanate substrate in the openings, it is epitaxial in structure forming fine patterns that become superconducting below the critical transition temperature. A channel can be formed in the strontium titanate substrate. The epitaxial yttrium barium copper oxide pattern is formed in this channel to minimize possible exposure to the silicon nitride mask.

8 Claims, 3 Drawing Sheets

SELECTIVE EPITAXIAL GROWTH OF HIGH-$T_C$ SUPERCONDUCTIVE MATERIAL

This is a continuation of application Ser. No. 07/621,180, filed Nov. 30, 1990, now abandoned.

TECHNICAL FIELD

The present invention relates generally to thin films of superconductive materials and more particularily to patterning thin films of high-$T_c$ superconductive materials for superconducting circuits and other applications.

BACKGROUND ART

The development of perovskite superconductive materials such as $(La,Sr)CuO_4$ and $YBa_2Cu_3O_{7-\delta}$ having superconducting transition temperature well above the superconducting transition temperatures of conventional superconductive materials has excited great interest in attempting to fabricate microcircuits and other miniature structures from the perovskite superconductive materials. However, the superconductive properties of such perovskite materials are extremely sensitive to the processing history of the material. It has generally been found that when attempts are made to apply the fabrication techniques of conventional semiconductor microcircuits to form microcircuits of perovskite superconductive materials, the superconductive properties of the materials are deleteriously affected or even destroyed.

SUMMARY OF THE INVENTION

Broadly, the present invention concerns a method for producing a thin film of superconductive-phase-forming material on a substantially-crystalline substrate, which film has—in accordance with a predetermined pattern—at least one region which is substantially epitaxial in crystal structure and at least one region which is substantially nonepitaxial in crystal structure. As used herein, the term "epitaxial" applied to a film of material on a substantially-crystalline substrate implies that the film is at least locally effectively lattice matched to the crystal structure of the substrate. The regions of the film of superconductive material which are substantially epitaxial in crystal structure tend to become superconducting at temperatures below a critical transition temperature, whereas regions of the film of superconductive material which are substantially nonepitaxial in crystal structure tend not to become superconducting at temperatures below the critical transition temperature.

More specifically, the process of the invention to produce a film of a superconductive-phase-forming material having regions of substantially epitaxial structure and regions of substantially nonepitaxial structure in accordance with a predetermined pattern comprises the following steps. An epitaxial-growth-promoting substrate is coated with a layer of an epitaxial-growth-inhibiting material. When deposited on the epitaxial-growth-promoting substrate, the superconductive phase-forming material tends to form an epitaxial film. When deposited on the epitaxial-growth-inhibiting material, the superconductive phase-forming material tends not to form a film with an epitaxial structure.

The layer of epitaxial-growth-inhibiting material on the epitaxial-growth-promoting substrate is then coated with a layer of a radiation-sensitive resist. Selected areas of the layer of radiation-sensitive resist are then selectively exposed to radiation to define the desired pattern in terms of exposed and unexposed areas of the layer of resist.

The process of the invention includes the step of developing the resist to expose areas of the epitaxial-growth-inhibiting material through openings in the resist corresponding to the pattern defined by the selective exposure to radiation. The substrate bearing the epitaxial-growth-inhibiting layer and the developed resist is then subjected to etching conditions which are effective to remove selectively the epitaxial-growth-inhibiting material from the areas exposed through openings in the developed resist layer to expose the underlying substrate.

The layer of resist is then removed to leave the epitaxial-growth-promoting substrate bearing a layer of epitaxial-growth-inhibiting material having openings passing through it in accordance with the desired pattern so that corresponding areas of the underlying substrate are exposed through the openings.

A layer of the superconductive-phase-forming material is then deposited on the epitaxial-growth-promoting substrate bearing the patterned layer of epitaxial-growth-inhibiting material. The superconductive-phase-forming material which is deposited on the areas of the epitaxial-growth-promoting substrate exposed through the openings in the epitaxial-growth-inhibiting material forms an epitaxial film. The superconductive-phase-forming material which is deposited directly on the epitaxial-growth-inhibiting material tends to form a film with a nonepitaxial crystal structure. Consequently, the superconductive-phase-forming material thus deposited has regions with a substantially epitaxial crystal structure which essentially follow the pattern of the openings through the layer of epitaxial-growth-inhibiting material.

Preferred embodiments of the invention permit films of superconductive-phase-forming material with regions of substantially epitaxial structures to be produced with pattern features having dimensions of less than a micrometer.

Preferred methods of the invention do not require that the film of superconductive-phase-forming material be subjected to any etching process or heat treatment, which can cause degradation of the superconductive properties of the film.

Preferred superconductive-phase-forming materials for the invention include high-$T_c$ perovskite superconductive-phase forming materials such as $Bi_2CaSr_2Cu_2O_8$ material and $Tl_2Ca_2Ba_2Cu_3O_{10}$ material. The high-$T_c$ perovskite superconductive-phase-forming material $YBa_2Cu_3O_{7-\delta}$ is particularily preferred.

Preferred epitaxial-growth-promoting substrates for the invention include substantially crystalline magnesium oxide MgO, substantially crystalline zirconium oxide ZrO, substantially crystalline lanthanum gallate $LaGaO_3$, substantially crystalline lanthanum aluminate $LaAl_2O_3$, and substantially crystalline neodymium gallate $NdGaO_3$. Substantially crystalline strontium titanate $SrTiO_3$ is a particularily preferred epitaxial growth promoting substrate for the superconductive-phase-forming yttrium-barium-copper-oxide material $YBa_2Cu_3O_{7-\delta}$.

Preferred epitaxial-growth-inhibiting materials for the method of the invention include amorphous strontium titanate $SrTiO_3$ and amorphous silicon nitride deposited by a chemical vapor deposition ("CVD") process. Silicon nitride produced by a chemical-vapor-deposition process nominally has the chemical formula $Si_3N_4$, although the 3:4 atomic ratio of silicon to nitrogen is generally only roughly approximate and, depending on the starting materials, the silicon nitride may include a significant proportion of hydrogen in addition to silicon and nitrogen. For many applications, CVD-deposited silicon nitride is particularily preferred because of the ease by which this material may be processed.

However, silicon diffusing from silicon nitride may "poison" certain superconductive-phase-forming materials—including yttrium-barium-copper oxide—which may render silicon nitride less suitable for applications requiring superconductive elements having pattern features of extremely small dimensions.

Preferably the superconductive-phase forming material is deposited in the method of the invention by a vapor deposition process. For depositing the superconductive-phase-forming material yttrium barium copper oxide $YBa_2Cu_3O_{7-\delta}$, a laser ablation deposition process is particularly preferred. It is expected that other vapor deposition techniques such as sputtering, electron-gun evaporation, molecular beam epitaxy, and chemical vapor deposition may be suitable for depositing superconductive-phase-forming materials in certain applications.

In a particularly preferred embodiment of the invention, a film of the high-$T_c$ superconductive phase-forming material yttrium barium copper oxide $YBa_2Cu_3O_{7-\delta}$ having certain regions of substantially epitaxial structure and certain other regions of substantially nonepitaxial structure can be produced. For this preferred embodiment, strontium titanate $SrTiO_3$ has been found to be a suitable epitaxial-growth-promoting substrate and silicon nitride deposited by a CVD process has been found to be a suitable epitaxial-growth-inhibiting material. The high-$T_c$ superconductive-phase-forming material $YBa_2Cu_3O_{7-\delta}$ is preferably deposited by a laser-ablation process.

Films of yttrium-barium-copper oxide $YBa_2Cu_3O_{7-\delta}$ deposited in accordance with a preferred embodiment of the invention by a laser-ablation process on a work face of a substrate of substantially single-crystalline strontium titanate having an essentially [100] crystallographic orientation tend to be epitaxial. Certain of the crystallites of the epitaxial $YBa_2Cu_3O_{7-\delta}$ film thus deposited may have a c-axis oriented essentially parallel to the essentially [100]-oriented work face of the strontium-titanate substrate. Certain other crystallites of the epitaxial $YBa_2Cu_3O_{7-\delta}$ film thus deposited may have a c-axis oriented essentially perpendicular to the essentially [100]-oriented work face of the strontium titanate substrate, since a dimension of the unit cell of the $YBa_2Cu_3O_{7-\delta}$ in the c-axis direction is approximately three times the dimension in each of the a-axis and the b-axis directions. Crystallites of the $YBa_2Cu_3O_{7-\delta}$ material may thus be essentially locally lattice matched with the substantially crystalline strontium titanate substrate with the c-axis of the crystallites either essentially perpendicular or essentially parallel to the essentially [100]-oriented work face of the substrate. Preferably, essentially all of crystallites have c-axes oriented in substantially the same direction. Most preferably for many applications, the c-axes of the crystallites are oriented essentially perpendicular to the essentially [100]-oriented work face of the substrate.

Films of yttrium-barium-copper oxide $YBa_2Cu_3O_{7-\delta}$ deposited in accordance with a preferred embodiment of the invention by a laser-ablation process on a layer of silicon nitride deposited in turn by a CVD process on substantially single crystalline strontium titanate tend to be amorphous.

A particularily preferred radiation-sensitive resist is an electron-beam-sensitive resist material PMMA based on poly(methylmethacrylate). The resist PMMA may be exposed to the tracing of an electron beam in an electron-beam lithography system to define a desired pattern of exposed and unexposed areas on the layer of PMMA resist.

When silicon nitride is used as an epitaxial-growth-inhibiting material on a substrate of strontium titanate, reactive-ion etching is a preferred process for removing silicon nitride from regions exposed through openings in the developed resist layer.

For the high-$T_c$ superconductive phase-forming material yttrium barium copper oxide $YBa_2Cu_3O_{7-\delta}$ deposited by a laser-ablation process on a substrate of strontium titanate bearing a patterned layer of silicon nitride in a preferred embodiment of the invention, a film of substantially epitaxial $YBa_2Cu_3O_{7-\delta}$—which is superconducting below a critical transition temperature—forms on the exposed areas of the substrate, whereas a substantially amorphous film of $YBa_2Cu_3O_{7-\delta}$—which is resistive rather than superconducting at temperatures below the critical transition temperature—forms on the silicon nitride layer.

For certain applications, it may be advantageous to etch or otherwise form channels in the epitaxial-growth-promoting substrate in the pattern desired for the regions of the superconductive-phase-forming material having a substantially epitaxial structure. If a patterned layer of epitaxial-growth-inhibiting material on the epitaxial-growth-promoting substrate is in registry with the channels formed in the substrate, the superconductive-phase-forming material deposited on the substrate bearing the patterned layer will tend to fill the channels with superconductive-phase-forming material having a substantially epitaxial crystal structure. Preferably, the channels in the epitaxial-growth-promoting substrate are etched through the pattern openings in the patterned layer of epitaxial-growth-inhibiting material, thereby insuring that the channels are in registry with the openings. The superconductive-phase-forming material deposited outside of the channels on the layer of epitaxial-growth-inhibiting material tends to have a nonepitaxial crystal structure. Since the side walls of the channels in the substrate are formed of substantially crystalline epitaxial-growth-promoting material, it is expected that the superconductive-phase-forming material in the channels will tend to have a substantially epitaxial crystal structure essentially up to the face adjacent to the channel side walls. Consequently, it is expected that substantially epitaxial pattern elements in such channels may be generally formed narrower, more reliably, and of higher quality than pattern elements having side walls bounded by epitaxial-growth-inhibiting material.

If desired, multilayered superconductive circuit structures may be formed according to the present invention. In a preferred method for forming such multilayered circuit structures, channels may be formed in a work face of an epitaxial-growth-promoting substrate, a patterned layer of epitaxial-growth-inhibiting material formed on the substrate with openings in registry with the channels and a layer of superconductive-phase-forming material deposited on the substrate bearing the patterned layer. The resulting coated substrate may then be polished down to the work face of the substrate to remove the essentially nonepitaxial superconductive-phase-forming material and the layer of epitaxial-growth-inhibiting material leaving the substrate with the channels filled with substantially epitaxial superconductive-phase-forming material. The polished substrate may then be coated with an insulating epitaxial layer of epitaxial-growth-promoting material to yield a second work face having buried beneath it a patterned circuit of substantially epitaxial superconductive phase-forming material. The process may then be repeated to build up multiple layers of patterned circuits of substantially epitaxial superconductive-phase-forming material separated by insulating epitaxial layers of epitaxial-growth-promoting material.

Channels may preferably be formed in a face of a substantially crystalline strontium titanate $SrTiO_3$ wafer by liquid-phase etching using a patterned mask of silicon nitride and either a strong acid or a strong base as a liquid etchant. Alternatively, channels in such a strontium-titanate substrate can be formed by a dry etching process. For example, an argon ion plasma can be employed to dry etch the substrate by sputtering using a patterned mask of silicon nitride, silicon dioxide, calcium fluoride or aluminum oxide.

Preferred epitaxial-growth-promoting materials for insulating epitaxial layers in multilayered structures of patterned circuits of essentially epitaxial superconductive-phase-forming material include strontium titanate $SrTiO_3$, lead titanate $PbTiO_3$, lanthanium gallate $LaGaO_3$, and praseodymium barium copper oxide $PrBa_2Cu_3O_{7-\delta}$. Insulating epitaxial layers of such epitaxial-growth-promoting materials are preferably deposited by a sputtering process.

The method of the invention may be used to fabricate microminiature transmission lines having conductor elements made from substantially epitaxial superconductive-phase-forming material. When such a transmission line is cooled to below the superconductive transition temperature of the substantially epitaxial superconductive-phase-forming material, the conductor element becomes superconducting and the transmission line exhibits extremely low losses. For maximum dimensional control and reproducibility, it is preferred that the conductor element of the transmission line be formed in a channel extending through a substrate of epitaxial-growth-promoting material. For transmission lines, substrates of lanthanum gallate, neodymium gallate, and magnesium oxide are generally preferred relative to strontium titanate, since the dielectric constants of the preferred materials are lower than the dielectric constant of strontium titanate.

A preferred method of the invention may be used to make superconducting quantum interference devices ("SQUIDS") and other small superconducting devices. Superconducting coupling coils for SQUIDS having second-layer coil crossovers may be also made by preferred embodiments of the invention. Superconductive interconnection lines for packaging and superconductive bus lines for systems may be fabricated in accordance with preferred methods of the invention.

BRIEF DESCRIPTION OF THE DRAWINGS

Preferred embodiments of the invention are described below with reference to the following drawings.

EXAMPLE

A superconductive test-circuit device was fabricated according to the procedure set forth in the following paragraphs. The device had a layer of substantially amorphous, resistive yttrium barium copper oxide $YBa_2Cu_3O_{7-\delta}$ extending over a work face of a substrate wafer of essentially single-crystalline strontium titanate $SrTiO_3$. The layer of yttrium barium copper oxide was substantially amorphous and resistive with the exception of an essentially epitaxial, superconductive test circuit which was formed in the layer as described below.

The strontium-titanate wafer was approximately rectangular in shape, about 1 mm thick, about 15 mm long and about 10 mm wide. The work face of the wafer was highly polished substantially planar with a crystallographic orientation of substantially [100].

The work face of the strontium-titanate wafer was first rinsed in acetone and then rinsed in isopropyl alcohol to remove grease and particulates.

The strontium-titanate wafer was then placed in a Reinberg-type plasma deposition reactor commercially available from Plasma-Therm Inc. of Kresson, N.J. under the trade designation "model No. PK 2463." The plasma deposition reactor had two spaced-apart parallel-plate electrodes located in a vacuum-tight deposition chamber. The wafer was positioned between the parallel-plate electrodes adjacent to one of the electrodes with the work face of the wafer facing a gap between the electrodes. The strontium-titanate wafer in the plasma-deposition reactor was heated to a temperature in the range of about 300° C. The electrode opposing the substrate face of the wafer was heated to a temperature of about 60° C. Nitrogen $N_2$, ammonia $NH_3$, and a mixture of about two percent silane $SiH_4$ in nitrogen were caused to flow through deposition chamber of the plasma deposition reactor—the nitrogen at a flow rate of about 2.32 std cc/min, the ammonia at a flow rate of about 24.5 std cc/min, and the silane/nitrogen mixture at a flow rate of about 1.5 std 1/min. The total pressure in the deposition chamber was about 1.3 Torr. A radio-frequency power signal was applied to the parallel-plate electrodes at a power density of about 0.09 watts/cm$^2$ and a frequency of about 13.56 MHz to strike and sustain a plasma between the electrodes. The work face of the heated strontium-titanate wafer was exposed to the resulting plasma for roughly 170 seconds in order to deposit a film of silicon nitride on the substrate face about 50 nm thick.

Figure 1A:
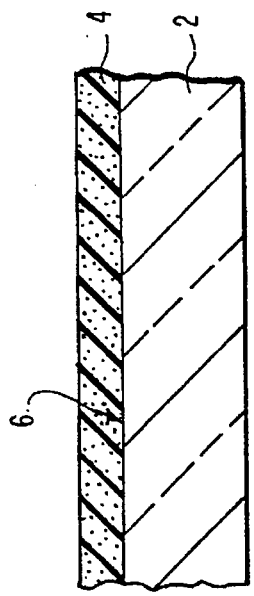
FIGS. 1a, 1b, 1c, 1d, 1e and 1f are simplified cross-sectional views of a substrate at stages during the course of a preferred embodiment of the method of the invention.

A schematic representation of a section of the strontium-titanate wafer 2 bearing the silicon-nitride coating 4 on the work face 6 of the wafer 2 is shown in FIG. 1(a).

The strontium-titanate wafer thus coated with silicon nitride was then removed from the plasma deposition reactor and a layer of a poly(methylmethacrylate) ("PMMA") electron-beam-sensitive positive resist about 100 nm thick was applied over the silicon-nitride layer. The PMMA resist had a molecular weight of about 360,000 daltons and was applied in solution to the wafer by a conventional spin application technique. The wafer was then baked at about 175° C. for about 2 hours to drive off the solvent and to improve the adhesion of the resist layer to the silicon-nitride surface over which it extended.

Figure 1B:
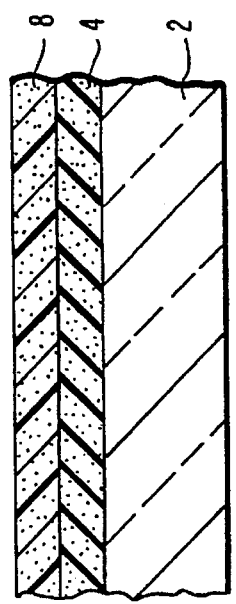

A schematic representation of the strontium-titanite wafer 2 with the the silicon-nitride coating 4 in turn coated with the PMMA-resist coating 8 is shown in FIG. 1(b).

Next, the strontium-titanate wafer was placed in a vacuum chamber and a layer of aluminum about 20 nm thick was evaporated over the PMMA resist layer.

The strontium-titanate wafer thus coated was then placed on an exposure stage in a vacuum chamber of a high-resolution vector-scan electron-beam lithography system. A beam-exposure pattern for the superconductive test circuit was traced on the coated surface of the strontium-titanate wafer with the electron beam of the electron-beam lithography system. The electron-beam lithography system was operated with a beam electron energy of about 50 keV and a base dose of about 175 µC/cm$^2$. At the beam electron energy employed, the aluminum layer on the wafer was essentially transparent to the electron beam. The aluminum layer served as an electrical discharge layer for the electron beam tracing.

Figure 2:
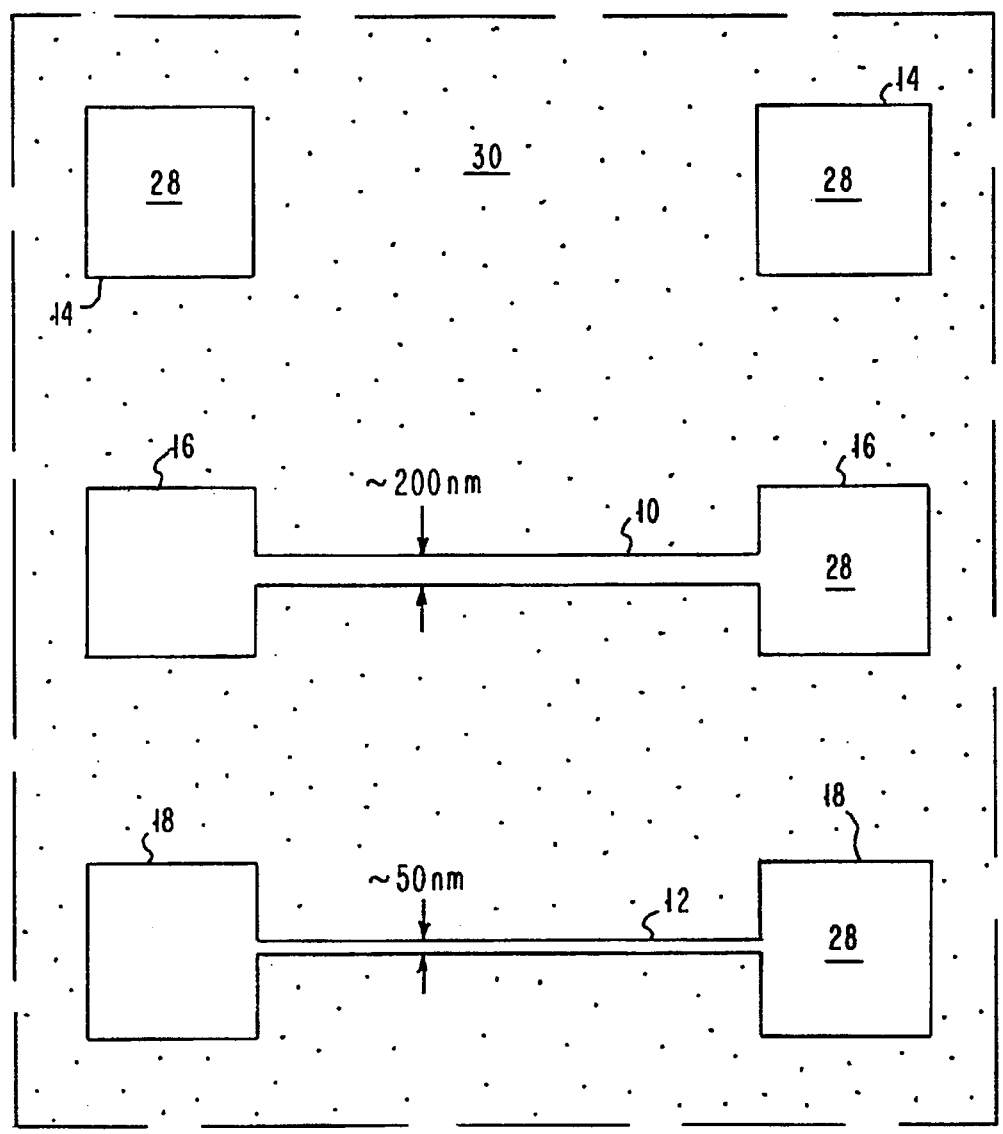
FIG. 2 is a simplified schematic top view of a portion of a test-circuit device made in accordance with the method of FIG. 1.

The test-circuit pattern traced by the electron beam—shown schematically in FIG. 2—included narrow-width-line pattern elements 10 which were about 200 nm wide and ultra-narrow-width-line pattern elements 12 which were about 50 nm wide. The test-circuit pattern also included coarser pattern elements for contact pads 14, 16, 18 and for interconnecting lines between the contact pads and the narrow-width and ultra-narrow-width lines of the circuit. Further details of the test circuit pattern are provided below in connection with describing the testing of the device.

After exposure to the electron beam, the coated strontium-titanate wafer was removed from the vacuum chamber of the electron-beam lithography system and the PMMA resist layer developed as follows.

First, the aluminum discharge layer was dissolved in a caustic potash developer solution based on potassium hydroxide commercially available from Shipley Co. Inc. of Newton, Mass. under the trade designation "Shipley AZ-Developer Type 2401." The caustic-potash developer solution was maintained at room temperature. To remove the aluminum discharge layer, the wafer was immersed in the caustic-potash developer solution for about ten seconds until dissolution of the aluminum layer was observed to be complete.

Figure 1C:
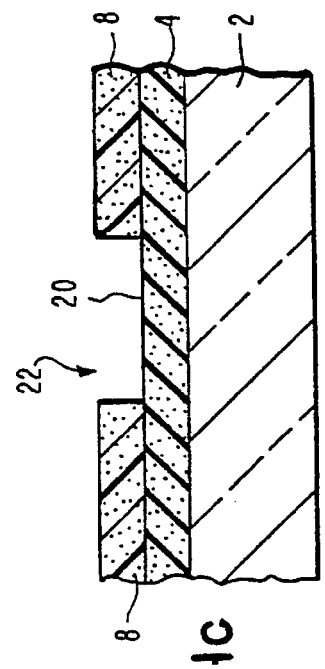

The wafer with the aluminum discharge layer removed was then immersed in an organic developer solution made up of about one part by volume of methylisobutylketone ("MIBK") and about two parts by volume of isopropyl alcohol ("IPA"). The temperature of the MIBK:IPA developer solution was maintained at approximately 21° C. The wafer was immersed in the MIBK:IPA developer solution for about 60 seconds. Regions of the layer of resist which had been irradiated with the electron beam in the electron-beam lithography system preferentially dissolved in the MIBK:IPA developer solution, so that circuit-pattern window openings were formed in the layer of resist which were defined by the beam-exposure pattern of the electron beam. Regions 20 of the silicon-nitride layer 4 beneath the layer of resist 8 were exposed through the circuit-pattern window openings 22 in the layer of resist 8, as shown schematically in FIG. 1(c).

Figure 1D:
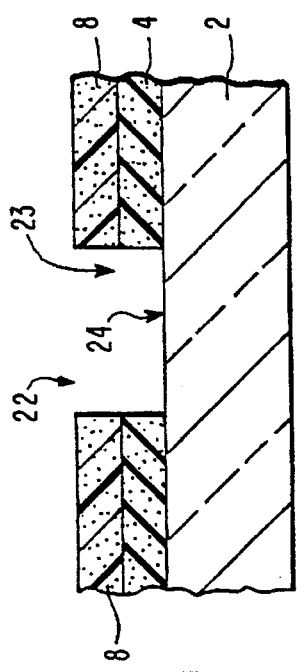

The strontium-titanate wafer bearing the layer of silicon nitride topped by the developed layer of the PMMA resist was then subjected to a dry etching process to remove selectively silicon nitride exposed through the circuit-pattern window openings in the layer of resist. To carry out the dry etching process, the wafer was placed on a cathode platen in a reactor chamber of a parallel-plate-electrode reactive-ion etching ("RIE") system commercially available from Plasma Technology Inc. of Concord, Mass. under the trade designation "Plasma Lab." Tetrafluoromethane CF$_4$ ("Freon 14") and oxygen O$_2$ were caused to flow through the reactor chamber—the tetrafluoromethane at a flow rate of about 9 std cc/min and the oxygen at a flow rate of about 1 std cc/min. The total pressure in the reactor chamber was maintained at approximately 20 mTorr. The parallel-plate electrodes of the reactive-ion etching system were energized for about 60 sec with a radio-frequency power signal having a frequency of about 13.56 MHz and a power density of about 0.2 watts/cm$^2$ to generate a plasma in the reactor chamber. The plasma thus generated produced reactive ions for the etching process. A DC bias potential of about −220 V developed on the cathode platen of the parallel-plate electrodes. The resulting etching rate for silicon nitride was about 51 nm/min. As a result of the reactive-ion etching process, portions of the silicon-nitride layer 4 which were exposed through the circuit-pattern window openings 22 in the resist layer 8 were substantially removed, exposing in turn regions 24 of the surface of the work face 6 of the strontium-titanate wafer 2 which corresponded to the circuit pattern traced by the electron beam of the electron-beam lithography system, as shown schematically in FIG. 1(d).

Figure 1E:
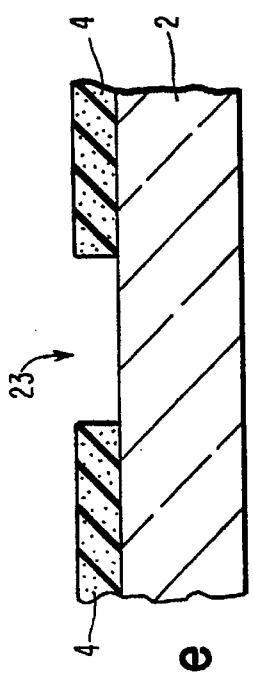

Without removing the strontium-titanate wafer from the cathode platen of the reactor chamber of the reactive-ion etching system, an oxygen plasma was generated in the reactor chamber to remove the PMMA resist layer. The oxygen plasma was generated by causing oxygen to flow through the reactor chamber at a flow rate of about 100 std cc/min with the pressure in the reactor chamber maintained at about 100 mTorr. The parallel-plate electrodes of the reactive-ion etching system were energized with a radio-frequency power signal having a frequency of about 13.56 MHz and a power density of approximately 0.15 watts/cm$^2$. A DC bias potential of about −100 volts developed on the cathode platen. The etch rate for the PMMA resist was about 100 nm/min. The wafer was exposed to the oxygen plasma for about 90 seconds. After exposure to the oxygen plasma, the strontium-titanate wafer 2 was essentially cleaned of the PMMA resist 8 and bore on the substrate face essentially only the layer of silicon nitride 4 having circuit-pattern window openings 23 passing through it corresponding to the desired test circuit pattern, as shown schematically in FIG. 1(e).

The strontium-titanate wafer bearing the patterned layer of silicon nitride was removed from the reactor chamber of the reactive-ion etching system and placed in a laser-ablation deposition chamber of a laser-ablation deposition system.

The laser-ablation system comprised a vacuum tight deposition-chamber housing made of stainless steel, the interior of which defined the laser-ablation deposition chamber. The deposition-chamber housing was generally cylindrical in shape—roughly 200 mm in diameter and roughly 400 mm long—with a cylinder axis extending axially substantially centrally through the housing. The deposition-chamber housing had five port openings passing through it. Each port opening was approximately 100 mm in diameter and was fitted with a vacuum-tight flange. A port opening located at one end of the deposition chamber served as a vacuum-pump port for connecting a vacuum pump and pressure gauges. Three midplane port openings were located substantially in a plane passing approximately midway through the deposition chamber essentially perpendicular to the cylinder axis. Three radial axes substantially in the midplane extending from the cylinder axis in a radial direction and passing respectively centrally through the three midplane ports defined azimuthal angles of about 0°, about 90°, and about 135°, respectively.

The midplane port opening through which the radial axis associated with the approximately 90° azimuthal angle passed served as a holder-jig port for receiving an ablation-source/deposition-substrate holder jig of the laser-ablation system. The ablation-source/deposition-substrate holder jig included an ablation-source-material pellet holder adapted to hold a pellet of an ablation source material and a deposition-substrate holder adapted to hold the strontium-titanate wafer bearing the patterned coating of silicon nitride. The ablation-source-material pellet holder and the deposition-substrate holder were made of stainless steel.

The deposition-substrate holder could be heated resistively to about 900° C. A deposition-substrate holder thermocouple was embedded in the deposition-substrate holder for monitoring the temperature of the deposition substrate holder during the deposition process. For effective thermal contact, the strontium-titanate wafer substrate was glued to the deposition-substrate holder with a silver paste. A thermocouple lead with a substrate-surface thermocouple at its end extended from the deposition-substrate holder to permit the temperature of a deposition surface of the strontium-titanate wafer mounted in the holder to be measured during the laser-ablation deposition process.

When the ablation-source/deposition-substrate holder jig was located in the laser-ablation deposition chamber in an operating position and orientation, the ablation-source-material pellet holder and the deposition-substrate holder held the disk-shaped ablation-source-material pellet and the strontium-titanate substrate wafer in an opposing face-to-face orientation spaced apart from one another by about 45 mm.

In addition, the deposition-substrate holder permitted the strontium-titanate substrate wafer mounted in the holder to be pivoted approximately 90° about an axis substantially parallel to the axis of the laser-ablation deposition chamber to permit the work-face side of the coated wafer to face the midplane port associated with the radial axis corresponding to the azimuthal angle of about 0°.

The two midplane port openings corresponding to the radial axes with azimuthal angles of about 0° and about 135°, respectively, were glazed with fused silica windows about 100 mm in diameter. The glazed midplane port opening corresponding to the radial axis of about 135° served as a laser-beam-entrance port and permitted a laser beam to be directed into the laser-ablation deposition chamber along a direction generally parallel to the approximately 135° radial axis. The midplane port opening corresponding to the radial axis with azimuthal angle of about 0° served as an inspection viewport and permitted viewing of the plume ablated from the ablation-source material during the laser-ablation deposition process and for viewing the strontium-titanate substrate wafer face on when the work-face side of the wafer was pivoted to face the port opening.

The ablation-source-material pellet was about 3 mm thick and disk-shaped about 25 mm in diameter and was made of sintered yttrium barium copper oxide $YBa_2Cu_3O_{7-\delta}$. The yttrium barium copper oxide was prepared from a mixture of $Y_2O_3$, $BaCO_3$ and $CuO$ in proportions to give the desired stoichiometry. The mixture was heated in oxygen at about 925° for about eight hours. The resulting material was then ground, pressed into a pellet, and heated to about 900° C. in air for about sixteen hours. The pellet was then furnace cooled slowly to room temperature over about eight hours. Suitable pellets of yttrium barium copper oxide may also be purchased commercially.

Pulses of an excimer laser having a wavelength of about 248 nm and a pulse duration of about 8 ns were used for the laser ablation process. The laser pulse repetition rate was about 4 Hz. The laser beam was directed through the laser-beam-entrance port into the laser-ablation deposition chamber and onto the ablation-source material pellet at an angle of about 45° to a normal to an ablation face of the pellet. The laser beam was focused with a focussing lens down to an area of about 2.5 mm by about 1.5 mm on the ablation face of the pellet. A fluence of about 2 $J/cm^2$ was used. The laser beam was continuously rastered over an area about 6 mm by about 6 mm of the ablation face. To raster the laser beam, the focusing lens for the excimer laser was mounted on a translation stage which was programmed to move horizontally and vertically so as to translate the laser beam in a zig-zag pattern on the pellet. The laser-ablation system generally produced a coating with a thickness which was uniform to within about ±10 percent over an area of about 15 mm by about 15 mm on the deposition surface of a deposition substrate, which was adequate for the approximately 15 mm by 10 mm strontium-titanate substrate wafer of the test-circuit device of this example.

For a laser-ablation deposition run, the laser-ablation deposition chamber was flushed with oxygen by filling the deposition chamber with oxygen to a pressure of about one atmosphere and then evacuating the deposition chamber to a vacuum base pressure of about 2 µTorr. After the flushing with oxygen, the laser-ablation deposition chamber was filled with oxygen to a pressure of about 200 mTorr. The strontium-titanate substrate wafer was heated with the resistive heater of the deposition-substrate holder to a temperature in the range of from about 700° to about 750° C. as measured at the deposition surface with the substrate-surface thermocouple.

Irradiation with the excimer laser beam was then begun. A laser-produced ablation plume from the yttrium-barium-copper-oxide ablation-source-material pellet in the approximately 200 mTorr oxygen ambient was purplish in color and had a cross-section of roughly about 20 mm diameter on the deposition substrate. During the deposition run, the temperature of the deposition surface of the coated strontium-titanate substrate wafer was maintained at a temperature in the range of from about 700° C. to about 750° C. The ablation-source-material pellet of yttrium barium copper oxide was not heated.

At the end of the laser-ablation deposition process, oxygen to about one atmosphere was added slowly to the deposition chamber while the temperature of the strontium-titante substrate wafer was approximately simultaneously lowered to about 400° C. The substrate wafer bearing the deposited coating was left at this temperature for about 30 minutes and then slowly cooled down to room temperature.

Figure 1F:
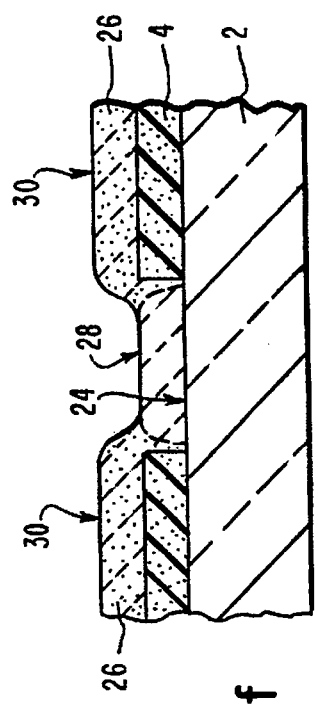

The fabrication of the superconductive test-circuit device was then complete—no further processing was required. As shown schematically in FIG. 1(f), the completed test-circuit device had a layer 26 of yttrium barium copper oxide over the patterned silicon-nitride layer 4.

The superconductive test-circuit device was then removed from the deposition chamber of the laser-ablation deposition system to inspect the superconductive test-circuit device and verify the functioning of the device.

The superconductive test-circuit device was first examined under both electron and optical microscopes. The test circuit pattern traced by the electron beam of the electron-beam lithography system was visible under the microscope in the layer of yttrium barium copper oxide of the device. Both the narrow-width and the ultra-narrow-width line elements of the pattern were visible, along with the contact-pad regions. As shown schematically in FIG. 1(f), pattern-element portions 28 of the yttrium-barrium-copper-oxide layer 26 which were deposited in the pattern openings 23 in the silicon-nitride layer 4 were substantially epitaxial in structure. Non-pattern-element portions 30 of the yttrium-barium-copper-oxide layer 26 which were deposited over the silicon-nitride layer layer 4 were essentially amorphous in structure.

Test-probe leads were attached to the contact-pad regions formed in the yttrium barium copper oxide layer of the test circuit device. The device was then cooled to about 4° K. and the electrical resistance between various contact-pad regions was measured. There were three groups of pairs of contact-pad regions in the test circuit pattern.

As shown schematically in FIG. 2, two first-contact-pad regions 14 of each pair in the first group were not connected by epitaxial elements of the test-circuit pattern. The electrical resistance between the two first contact-pad regions of each pair in the first group was found to be high, which indicated that even at about 4° K. at least portions of the yttrium barium copper oxide material in every current path between the two contact pads was resistive.

Two second-contact-pad regions 16 of each pair of contact-pad regions in the second group were connected by circuit-pattern elements which included in series a narrow-width-line epitaxial pattern element as shown schematically in FIG. 2. The electrical resistance between the two contact-pad regions of each pair in the second group was found to be zero within the limits of the sensitivity of the resistance-measurement instrument. The essentially zero resistance indicated that the elements of the test-circuit pattern formed in the yttrium barium copper oxide layer connecting the two contact pad regions were superconducting at about 4° K.

Two third-contact-pad regions 18 of each pair in the third group of contact-pad regions were connected by circuit-pattern elements which included in series an ultra-narrow-width-line pattern element 12, as shown schematically in FIG. 2. The electrical resistance between the two contact-pad regions of each pair in the third group was found to be high when the device was at about 4° K. It is thought that the resistance may have been due to particulates which were generated in the laser ablation deposition process and which fell upon and occluded the ultra-narrow-width-line elements.

The electrical resistance measurements indicated that the test-circuit pattern in the yttrium-barium-copper-oxide layer of the test circuit epitaxial device was effectively superconducting at about 4° K. and that the portion of the coating not included in the test-circuit pattern was normally resistive at that temperature.

The electrical resistance between a pair of the contact-pad regions of the second group which included epitaxial circuit elements was measured as a function of temperature. The onset of the superconductive transition was found to be about 86° K. The temperature at which the resistance was found to vanish within the sensitivity limits of the measurement instrument was found to be about 75° K. The critical superconductive transition temperature for the test circuit pattern elements which included a narrow-width-line element was thus found to be substantially the same as unpatterned deposited films of superconductive yttrium barium copper oxide deposited on strontium titanate by laser ablation. The breadth of the superconductive transition was somewhat greater for the test-circuit pattern elements which included the narrow-width-line element than for unpatterned laser-ablation deposited films of superconductive yttrium barium copper oxide on strontium titanate.

Turning now to FIGS. 3(a) through 3(f), a work face 106 of a strontium-titanate wafer 102 may be coated with a layer 104 of silicon nitride which in turn may be coated with a layer 108 of PMMA resist. The PMMA-resist layer 108 may be exposed and developed and the silicon-nitride layer 104 dry etched as described above in connection with FIGS. 1(a) through 1(d). The resulting strontium-titanate wafer 102 bearing patterned a layer 104 of silicon nitride topped by a patterned layer 108 of PMMA resist is shown schematically in FIG. 3(a).

Figure 3A:
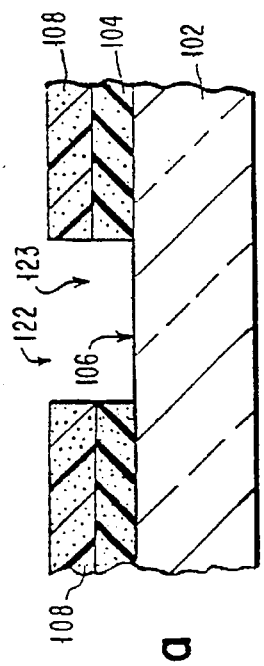
FIGS. 3a, 3b, 3c, 3d, 3e and 3f are simplified cross-sectional views of a substrate at stages during the course of an alternative preferred embodiment of the method of the invention for forming multilayered superconductive circuit patterns.
Figure 3B:
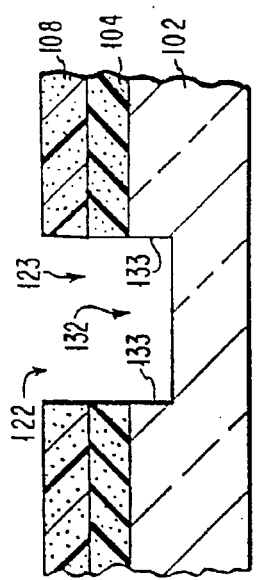
Figure 3C:
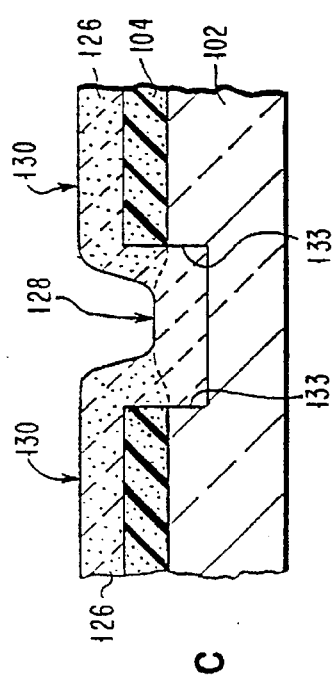
Figure 3D:
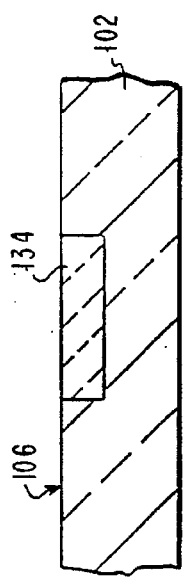
Figure 3E:
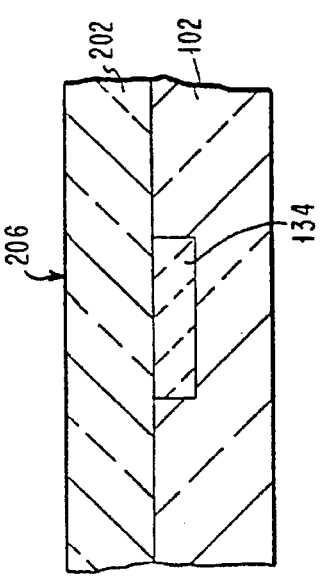

The strontium-titanate wafer 102 bearing the patterned layers 104, 108 of silicon nitride and resist may be dry etched with an argon-ion plasma to form a channel 132 in the strontium-titanate wafer 102 through pattern windows openings 122, 123 in the silicon-nitride layer 104 and the PMMA-resist layer 108, as shown schematically in FIG. 3(b). The channel 132 has channel side-walls 133.

The PMMA-resist layer 108 may then be removed by an oxygen plasma as discussed above in connection with FIG. 1(e). A layer 126 of yttrium barium copper oxide may be deposited on the channelled strontium-titanate wafer 102 bearing the patterned silicon-nitride layer 104 by laser ablation as described above in connection with FIG. 1(f). As shown schematically in FIG. 3(c), pattern-element portions 128 of the yttrium-barium-copper-oxide layer 126 deposited within the channel 132 in the strontium-titanate wafer 102 may be substantially epitaxial in structure. The substantially epitaxial structure may extend to the side walls 133 of the channel 132. Non-pattern-element portions 130 of the yttrium-barium copper oxide layer 126 deposited over the silicon-nitride layer 104 may be essentially amorphous in structure.

The patterned silicon-nitride layer 104 on the work face 106 of the strontium-titanate wafer 102 and portions of the yttrium-barium-copper-oxide layer 126 outside of the channel 132 in the wafer 102 may be removed by polishing down to approximately the level of the work face 106. The resulting substantially epitaxial yttrium barium copper oxide filling the channel 132 in the strontium-titanate wafer 102 may form a circuit pattern element 134 having an approximately planar face extending parallel to the work face 106 of the wafer 102, as shown schematically in FIG. 3(d). An insulating epitaxial layer 202 of strontium titanate may be deposited by sputtering on the work face 106 and the face of the substantially epitaxial yttrium-barium-copper oxide circuit pattern element 134. The substantially-epitaxial yttrium-barium-copper-oxide circuit pattern element 134 in the channel 132 is buried beneath the insulating epitaxial layer 202, as shown schematically in FIG. 3(e). A surface of the insulating epitaxial layer 202 forms a second work face 206.

Figure 3F:
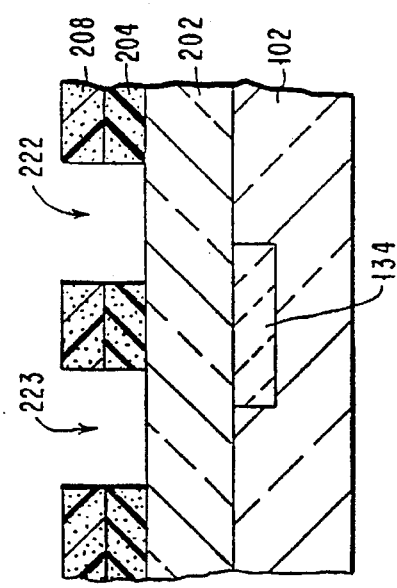

The coating, exposing, developing, etching, channelling and deposition processes described above may be repeated to fabricate one or more additional layers of substantially epitaxial yttrium-barium-copper-oxide circuit pattern elements over the buried substantially epitaxial yttrium-barium-copper-oxide circuit pattern element 134. FIG. 3(f) shows schematically for a second layer the stage of processing illustrated schematically for the first layer in FIG. 3(a).

It is not intended to limit the present invention to the specific embodiments described above. For example, resistless techniques to pattern the epitaxial-growth-inhibiting layer may be used, such as laser ablation, focussed ion beam patterning, and beam induced chemical etching. Lift-off techniques may also be used if desired. It is recognized that changes may be made in the devices and processes specifically described herein without departing from the scope and teaching of the instant invention, and it is intended to encompass all other embodiments, alternatives and modifications consistent with the invention.

We claim:

1. A process for producing a film of a superconductive-phase-forming material having regions of substantially epitaxial structure and regions of substantially nonepitaxial structure in accordance with a predetermined pattern, comprising:

(a) coating an epitaxial-growth-promoting substrate with a layer of an epitaxial-growth-inhibiting material, the epitaxial-growth-promoting substrate being such that when the superconductive-phase-forming material is deposited on the epitaxial-growth-promoting substrate, the superconductive-phase-forming material tends to form an epitaxial film, the epitaxial-growth-inhibiting material being such that when the superconductive-phase-forming material is deposited on the epitaxial-growth-inhibiting material, the superconductive-phase-forming material tends not to form a film with an epitaxial structure;

(b) patterning the layer of epitaxial-growth-inhibiting material to leave the epitaxial-growth-promoting substrate bearing a layer of epitaxial-growth-inhibiting material having openings passing through it in accordance with the desired pattern so that corresponding areas of the underlying substrate are exposed through the openings;

(c) etching the epitaxial-growth-promoting substrate to form channels in the substrate substatially in registry with the openings in the layer of epitaxial-growth-inhibiting material on the substrate; and (d) depositing a layer of the superconductive-phase-forming material on the epitaxial-growth-promoting substrate bearing the layer of epitaxial-growth-inhibiting material, the superconductive-phase-forming material which is deposited in the channels of the epitaxial-growth-promoting substrate exposed through the openings in the epitaxial-growth-inhibiting material forming an epitaxial film, the superconductive-phase-forming material which is deposited directly on the epitaxial-growth-inhibiting material tending to form a film with a nonepitaxial structure, the superconductive-phase-forming material thus deposited having regions with a substantially epitaxial crystal structure within the channels in substantial registry with the pattern of the openings through the layer of epitaxial-growth-inhibiting material.

2. The process according to claim 1 in which the superconductive-phase-forming material comprises yttrium barium copper oxide.

3. The process according to claim 2 in which the epitaxial-growth-promoting substrate comprises substantially single-crystalline strontium titanate.

4. The process according to claim 2 in which the epitaxial-growth-inhibiting material is silicon nitride.

5. The process according to claim 2 in which the epitaxial-growth-inhibiting material is amorphous strontium titanate.

6. A process for producing a fine pattern of superconductive-phase-forming material with a epitaxial crystal structure comprising:

(a) coating an epitaxial-growth-promoting substrate with a layer of silicon nitride as an epitaxial-growth-inhibiting material, the superconductive-phase-forming material tends to form an epitaxial film on the epitaxial-growth promoting substrate, the epitaxial-growth-inhibiting material being such that when the superconductive-phase-forming material is deposited on the epitaxial-growth-inhibiting material, the superconductive-phase-forming material tends not to form a film with an epitaxial structure;

(b) patterning the layer of epitaxial-growth-inhibiting material to leave the epitaxial-growth-promoting substrate bearing a layer of epitaxial-growth-inhibiting material having openings passing through it in accordance with the pattern so that corresponding areas of the underlying substrate are exposed through the openings;

(c) etching the epitaxial-growth-promoting substrate to form channels in the substrate substantially in registry with the openings in the layer of epitaxial-growth-inhibiting material on the substrate;

(d) depositing a layer of the superconductive-phase-forming material on the epitaxial-growth-promoting substrate bearing the layer of epitaxial-growth-inhibiting material, the superconductive-phase-forming material which is deposited in the channels of the epitaxial-growth-promoting substrate exposed through the openings in the epitaxial-growth-inhibiting material forming an epitaxial film with limited exposure to the epitaxial-growth-inhibiting material, the superconductive-phase-forming material which is deposited directly on the epitaxial-growth-inhibiting material tending to form a film with a nonepitaxial structure, the superconductive-phase-forming material thus deposited having regions with a substantially epitaxial crystal structure within the channels in substantial registry with the pattern of the openings through the layer of epitaxial-growth-inhibiting material;

(e) stripping off the layer of epitaxial-growth-inhibiting layer and the superconductive-phase-forming layer with nonepitaxial crystal structure deposited thereon leaving the regions with a substantially epitaxial crystal structure within the channels; and (f) covering the channel with an insulating epitaxial layer to provide protection for the regions with a substantially epitaxial crystal structure from interaction or interdiffussion with other materials.

7. The process according to claim 6 in which both the epitaxial-growth-promoting-substrate and the insulating epitaxial layer comprise substantially single-crystalline strontium titanate.

8. The process according to claim 7 in which the superconductive-phase-forming material comprises yttrium barium copper oxide.

* * * * *